United States Patent
Sin et al.

(10) Patent No.: US 6,713,801 B1
(45) Date of Patent: Mar. 30, 2004

(54) α-TANTALUM LEAD FOR USE WITH MAGNETIC TUNNELING JUNCTIONS

(75) Inventors: Kyusik Sin, Pleasanton, CA (US); Hugh C. Hiner, Fremont, CA (US); Xizeng Shi, Fremont, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 0 days.

(21) Appl. No.: 10/192,430

(22) Filed: Jul. 9, 2002

(51) Int. Cl.[7] .............................................. H01L 29/76
(52) U.S. Cl. ...................... 257/295; 257/296; 257/300; 257/421; 438/3; 438/240
(58) Field of Search ................................. 257/108, 252, 257/295–313, 421–427

(56) References Cited

U.S. PATENT DOCUMENTS

| | | | | |
|---|---|---|---|---|
| 5,764,567 A | * | 6/1998 | Parkin | 365/173 |
| 5,801,984 A | * | 9/1998 | Parkin | 365/158 |
| 5,841,692 A | * | 11/1998 | Gallagher et al. | 365/173 |
| 5,898,549 A | * | 4/1999 | Gill | 360/113 |
| 5,920,446 A | * | 7/1999 | Gill | 360/113 |
| 6,219,212 B1 | * | 4/2001 | Gill et al. | 360/324.2 |
| 6,518,588 B1 | * | 2/2003 | Parkin et al. | 257/295 |
| 6,574,079 B2 | * | 6/2003 | Sun et al. | 360/324.2 |
| 2002/0067580 A1 | * | 6/2002 | Li et al. | 360/321 |
| 2002/0097534 A1 | * | 7/2002 | Sun et al. | 360/324.2 |

* cited by examiner

Primary Examiner—David Nelms
Assistant Examiner—Andy Huynh
(74) Attorney, Agent, or Firm—Sawyer Law Group LLP

(57) ABSTRACT

A method and system for providing a tunneling junction is disclosed. The method and system includes providing a free layer, a pinned layer, and a barrier between the free layer and the pinned layer. The free layer and the pinned layer are ferromagnetic. The barrier layer is an insulator. The magnetic tunneling junction is coupled to an α-Ta lead.

12 Claims, 3 Drawing Sheets

α-TANTALUM LEAD FOR USE WITH MAGNETIC TUNNELING JUNCTIONS

FIELD OF THE INVENTION

The present invention relates to magnetic system, and more particularly to a method and system for providing magnetic tunneling junctions having improved reliability.

BACKGROUND OF THE INVENTION

Because of their high magnetoresistanse ratio, spin dependent tunneling sensors, otherwise known as magnetic tunneling junctions (MTJs), are currently of interest for use in a variety of devices, including magnetic memories such as magnetic random access memories (MRAM). FIG. 1 depicts a portion of a conventional magnetic memory, a conventional MRAM 1. The conventional MRAM 1 includes MTJs 10. Each MTJ 10 includes at least a conventional pinned layer 20, a conventional barrier layer 30 and a conventional free layer 40. The conventional barrier layer 30 is typically an insulator that serves as a tunneling barrier between the conventional pinned layer 20 and the conventional fire layer 40. The conventional pinned layer 20 and the conventional free layer 40 are ferromagnetic. The magnetization of the conventional pinned layer 20 is pinned in a particular direction, generally by an antiferromagnetic layer (not shown). The magnetization of the conventional free layer 40 is free to rotate in response to an external field. The conventional MRAM 1 includes a conventional bit line 60 and a conventional bottom lead 50. Current through the MTJ 10 is carried by the conventional bit line 60 and the conventional bottom lead 50.

FIG. 2 is a more detailed diagram of a conventional MTJ 10 and the bottom lead 50. The conventional MTJ 10 includes a conventional seed layer 12 and a conventional antiferromagnetic layer 14. The conventional MTJ 10 shown utilizes a conventional synthetic pinned layer 20. The conventional synthetic pinned layer 20 includes conventional ferromagnetic layers 22 and 26 separated by a nonmagnetic spacer layer 24. The conventional ferromagnetic layers 22 and 26 are antiferromagnetically coupled. The conventional barrier layer 30 is typically $Al_2O_3$. In addition, the MTJ 10 typically includes a conventional capping layer 16. The conventional bit line 60 is generally coupled to the conventional capping layer 16. The conventional bottom lead 50, which typically carries a current during reading and writing, is generally composed of Cu or Al. As a result, the conventional bottom lead 50 has a high electrical conductivity, allowing for current to be carried by the conventional bottom lead with little loss.

Although the conventional MRAM 1 and conventional MTJ 10 function, one of ordinary skill in the art will readily recognize that the conventional MTJ 10 may be subject to failure. In particular, conventional barrier layer 30 can be nonuniform. The conventional barrier layer 30 is also typically very thin to allow tunneling of current carriers between the conventional pinned layer 20 and the conventional free layer 40. Because of this nonuniformity, the conventional tunneling barrier 30 is subject to pinholes and other defects which decrease the reliability of the conventional tunneling barrier 30. For example, the current through the conventional tunneling barrier 30 may vary and/or the conventional tunneling barrier 30 may be subject to breakdown. The reliability of the conventional tunneling barrier 30 and, therefore, the reliability of the conventional MTJ 10 are adversely affected.

Accordingly, what is needed is a system and method for providing a more reliable MTJ. The present invention addresses such a need.

SUMMARY OF THE INVENTION

The present invention provides a method and system for providing a tunneling junction. The method and system comprise providing a free layer, a pinned layer, and a barrier between the free layer and the pinned layer. The free layer and the pinned layer are ferromagnetic. The barrier layer is an insulator. The magnetic tunneling junction is coupled to an α-Ta lead.

According to the system and method disclosed herein, the present invention provides a magnetic tunneling junction having improved reliability.

DESCRIPTION OF THE INVENTION

The present invention relates to an improvement in spin dependent tunneling sensors. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing a tunneling junction. The method and system comprise providing a free layer, a pinned layer, and a barrier between the free layer and the pinned layer. The free layer and the pinned layer are ferromagnetic. The barrier layer is an insulator. The magnetic tunneling junction is coupled to an α-Ta lead.

The present invention will be described in terms of a particular spin-dependent tunneling sensor using particular materials and having particular components. However, one of ordinary skill in the art will readily recognize that this method and system will operate effectively for other spin-dependent tunneling sensors using other materials and having othe and/or different components tat are consistent with the present invention. The present invention is also described in the context of a particular magnetic memory. However, one of ordinary skill in the art will readily realize that the present invention is consistent with other memories utilizing spin-dependent tunneling sensors for storing data.

Figure 1:
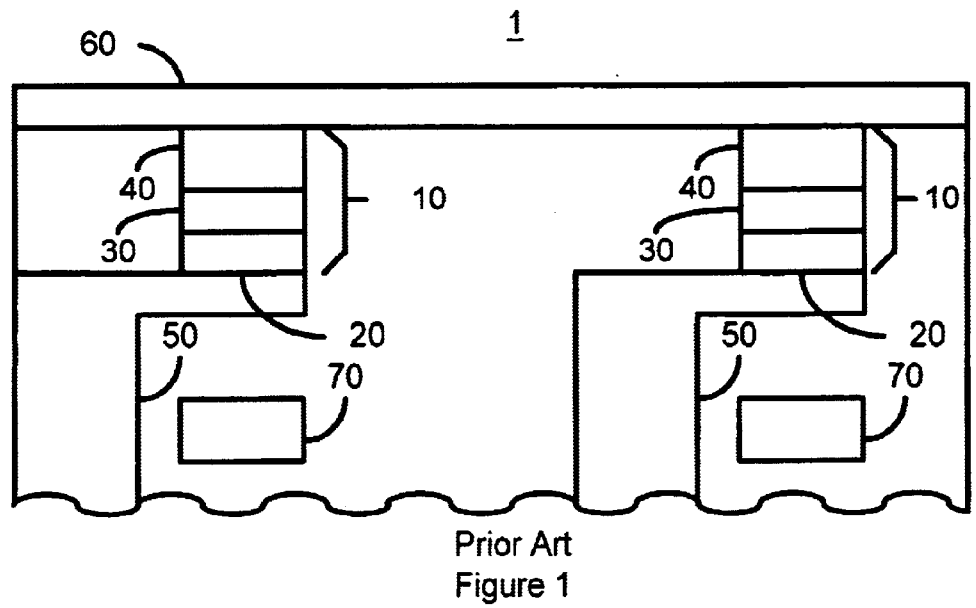
FIG. 1 is a diagram of a conventional memory array using conventional magnetic tunneling junctions using conventional bottom leads.
Figure 2:
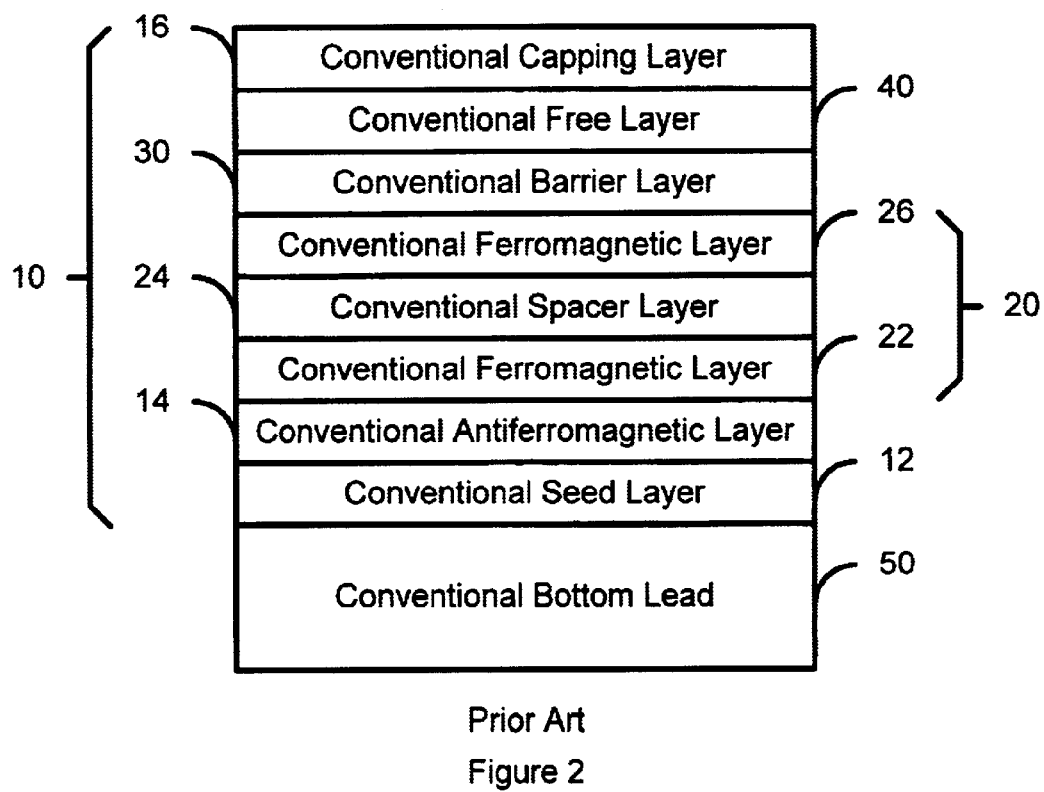
FIG. 2 is a diagram of a conventional spin dependent tunneling sensor having a bottom synthetic pinned layer, as FIG. 3 is a high-level diagram of one embodiment of a magnetic tunneling junction utilizing one embodiment of an α-Ta lead in accordance with the present invention.
Figure 3:
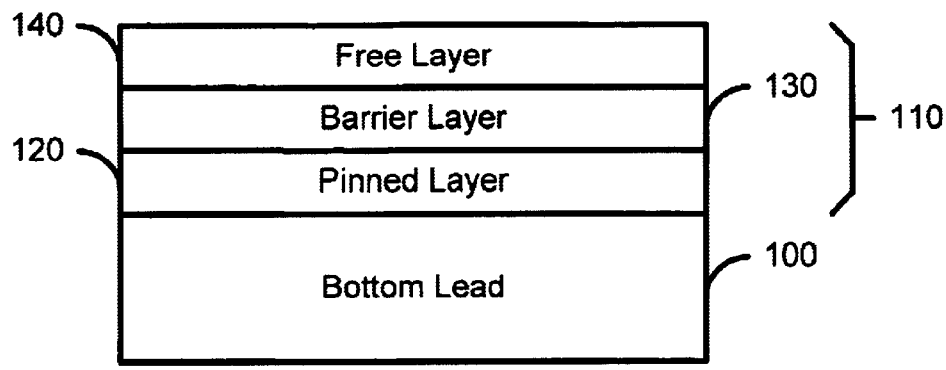

To more particularly illustrate the method and system in accordance with the present invention, refer now to FIG. 3, depicting one embodiment of a magnetic tunneling junction utilizing a lead 100 in accordance with the present invention. The magnetic tunneling junction 110 includes a pinned layer 120, a barrier layer 130 and a free layer 140. The pinned layer 120 and the free layer 140 are ferromagnetic. The pinned layer 120 and/or the free layer 140 may be synthetic. Other layers may also be synthetic, multilayers, alloys or other materials. The pinned layer 120 has its magnetization substantially fixed, while the magnetization of the free layer 140 can respond to an applied magnetic field. The barrier layer 130 is an insulating layer sufficiently thin to allow the tunneling of current carriers between the pinned layer 120 and the free layer 140. The magnetic tunneling junction 110 resides on an α-Ta lead 100. The α-Ta lead 100 is preferably a bottom lead, the lead upon which the magnetic tunneling junction 110 is grown.

The α-Ta lead 100 has a body centered cubic (bcc) structure. This is different from β-Ta, which have a tetragonal structure, that is typically formed. The α-Ta is generally formed by selecting the appropriate seed layer (not shown) on which the Ta is grown. Because α-Ta is used in the α-Ta lead 100, the resistivity of the α-Ta lead 100 is significantly less than that of a lead formed using β-Ta. The resistivity of α-Ta is on the order of twenty micro-Ohm-cm, while the resistivity of β-Ta is on the order of one hundred eighty micro-Ohm cm. For example, in a lead having two hundred Angstroms of Ta, with a width of 0.32 µm and a length of 1.28 µm, it is calculated that a β-Ta will have a resistance of three hundred and sixty Ohms and will be eighteen percent of the junction resistance, while a α-Ta lead will have a resistance of forty Ohms and will be approximately two percent of the junction resistance when the junction resistance is two thousand Ohms. Thus, Ta becomes an appropriate material for use in a lead.

Furthermore, because α-Ta is the material used in the α-Ta lead 100, the lead 100 is smoother than a conventional lead. For example, the average roughness of over four hundred Angstroms α-Ta is below two Angstroms. In contrast, the average roughness of Cu, Al, or Au that are typically used for conventional leads is over four Angstroms. Because the bottom α-Ta lead 100 is smoother, the roughness of the layers of the magnetic tunneling s junction 110 are also smoother. Consequently, the barrier layer 130 is more uniform and, therefore, more reliable. In addition, α-Ta is simpler to pattern using a reactive ion etch (RIE) than other conductive materials, such as Cu or Au, that are used in conventional leads. Consequently, the fabrication of an α-Ta lead 100 may be easier than a conventional lead. In addition, the composition of the lead (α-Ta rather than β-Ta) may be confirmed using XPS, AES, TEM, EELS, PEELS, SIMS, XRF, or other similar crystallographic techniques.

Figure 4:
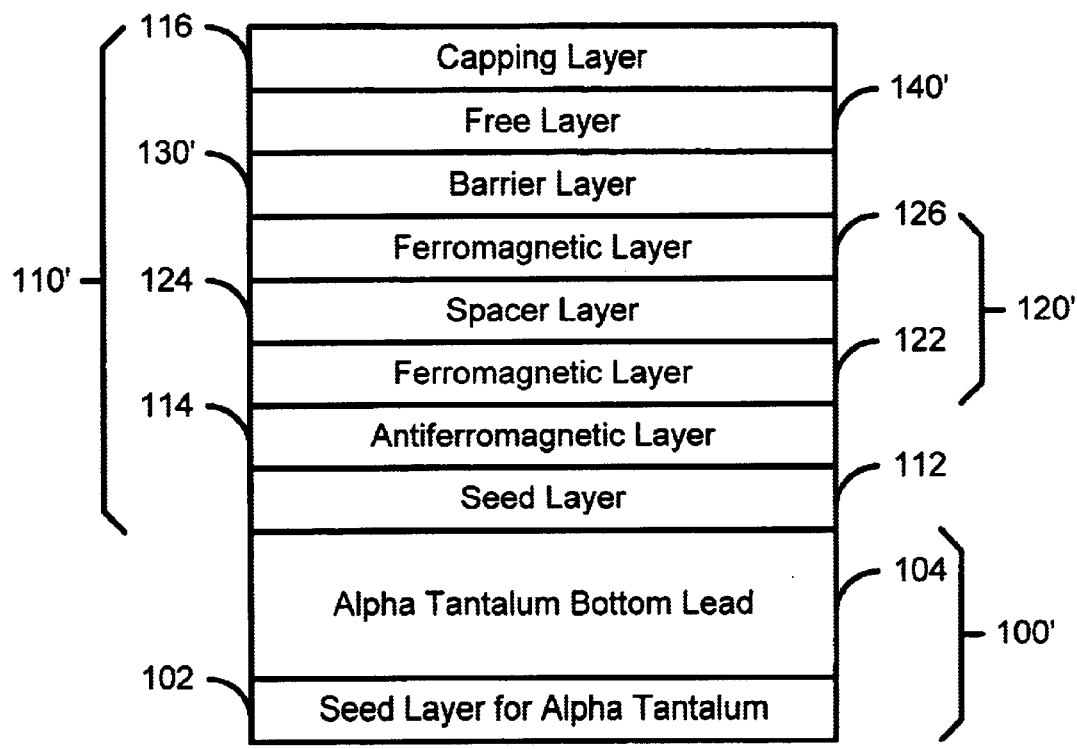
FIG. 4 is a more detailed diagram of one embodiment of a magnetic tunneling junction using one embodiment of an α-Ta lead in accordance with the present invention.

FIG. 4 is a more detailed diagram of a preferred embodiment of a magnetic tunneling junction 110' using one embodiment of an α-Ta lead 100' in accordance with the present invention. The α-Ta lead 100' includes a layer of α-Ta 104 and a seed layer 102. The seed layer 102 has a structure that is conducive to the formation of α-Ta as opposed to β-Ta In a preferred embodiment, the seed layer 102 is Cr. Also in a preferred embodiment, the Cr seed layer is thin, approximately between fifty and one hundred Angstroms. The α-Ta layer 104 is formed on the seed layer 102. As a result, the α-Ta layer 104 has a bcc structure instead of a tetragonal structure. Note that the α-Ta lead 100' is preferably a bottom lead for the magnetic tunneling junction 110'. The magnetic tunneling junction 110' includes a seed layer 112 and an antiferromagnetic layer 114. The seed layer 112 is appropriate for growing the desired structure of the antiferromagnetic layer 114. The magnetic tunneling junction 110' has a pinned layer 120', a barrier layer 130' and a free layer 140'. The pinned layer 120' and the free layer 140' are ferromagnetic. The pinned layer 120' is a synthetic pinned layer 120' including ferromagnetic layers 122 and 126 separated by a nonmagnetic spacer layer 124. The pinned layer 120' has its magnetization pinned by the antiferromagnetic layer 114. The barrier layer 130' is an insulator, such as alumina, and is preferably thin enough to allow tunneling of charge carriers between the pinned layer 120' and the free layer 140. The magnetization of the free layer 140' can respond to an external magnetic field. A capping layer 116 is also provided.

The α-Ta layer 104 in the α-Ta lead 100' has a body centered cubic (bcc) structure. This is different from β-Ta, which have a tetragonal structure, that is typically formed. The α-Ta is generally formed by selecting the appropriate seed layer (not shown) on which the to Ta is grown. Because α-Ta is used in the α-Ta lead 100', the resistivity of the α-Ta lead 100' is significantly less than that of a lead formed using β-Ta. The resistivity of α-Ta is on the order of twenty micro-Ohm-cm, while the resistivity of D-Ta is on the order of one hundred eighty micro-Ohm cm. For example, in a lead having two hundred Angstroms of Ta, with a width of 0.32 µm and a length of 1.28 µm, it is calculated that a β-Ta will have a resistance of three hundred and sixty Ohms and will be eighteen percent of the junction resistance, while a α-Ta lead will have a resistance of forty Ohms and will be approximately two percent of the junction resistance when the junction resistance is two thousand, Ohms.

Thus, Ta becomes an appropriate material for use in a lead.

Furthermore, because α-Ta is the material used in the α-Ta lead 100', the lead 100' is smoother than a conventional lead. For example, the average roughness of over four hundred Angstroms α-Ta is below two Angstroms. In contrast, the average roughness of Cu, Al, or Au that are typically used for conventional leads is over four Angstroms. Because the bottom α-Ta lead 100 is smoother, the roughness of the layers of the magnetic tunneling junction 110' are also smoother. Consequently, the barrier layer 130' is more uniform and, therefore, more reliable. In addition, α-Ta is simpler to pattern using a reactive ion ' etch (RIE) than other conductive materials, such as Cu or Au, that are used in conventional leads. Consequently, the fabrication of an α-Ta lead 100' may be easier than a conventional lead. In addition, the composition of the lead (α-Ta rather than β-Ta) may be confirmed using XPS, AES, TEM, EELS, PEELS, SIMS, XRF, or other similar crystallographic techniques.

Figure 5:
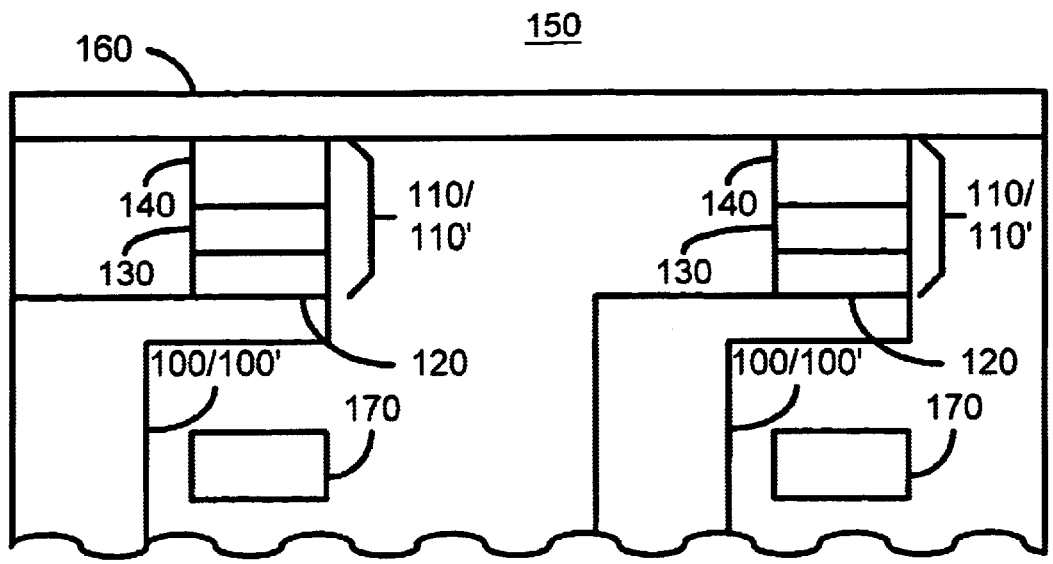
FIG. 5 is a diagram of one embodiment of a magnetic memory array utilizing one 2o embodiment of a magnetic tunneling junction and one embodiment of α-Ta lead in accordance with the present invention.

FIG. 5 is a diagram of one embodiment of a magnetic memory array 150 utilizing one embodiment of a magnetic tunneling junction 110/110' and one embodiment of an α-Ta lead 100/100' in accordance with the present invention. Because the α-Ta lead 100/100' is used, the magnetic tunneling junctions 100/100' are more reliable. In addition, the magnetic memory 150 may be simpler to fabricate because the α-Ta leads 100/100' may be easier to fabricate.

Figure 6:
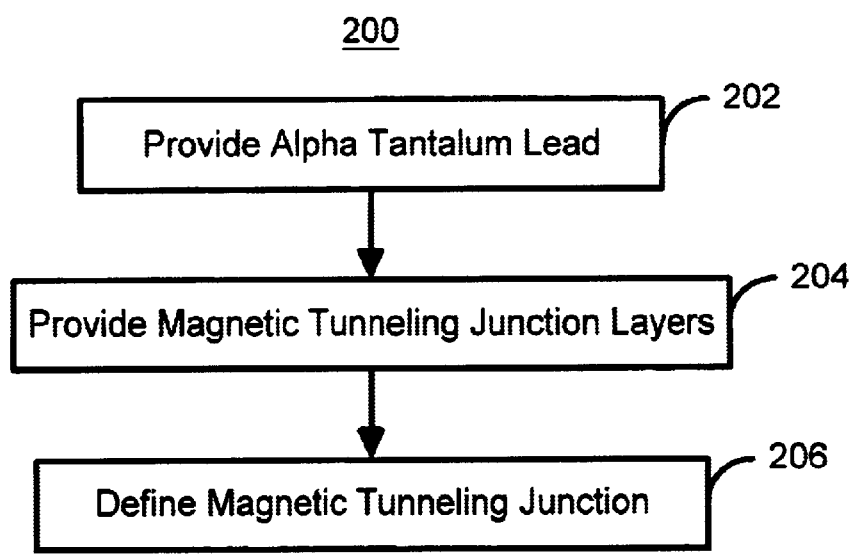
FIG. 6 is a high-level flow chart of one embodiment of a method for providing a magnetic tunneling junction using an α-Ta lead in accordance with the present invention.

FIG. 6 is' a high-level flow chart of one embodiment of a method 200 in accordance with the present invention for providing one embodiment of a magnetic tunneling junction 110/110' and one embodiment of an α-Ta lead 100/100'. An α-Ta lead is provided, via step 202. Step 202 preferably includes providing a seed layer, such as the seed layer 102 and providing a Ta layer on the seed layer, such as the Ta layer 104. The layers 102 and 104 are preferably deposited using DC or RF sputtering. Because the Ta layer is grown on the seed layer, the Ta layer is an α-Ta layer. Step 202 may also include patterning the layers 102 and 104 to form the α-Ta lead 100/100'. Patterning the layers may include performing an RIE. The magnetic tunneling layers are formed, via step 204. Step 204 preferably includes providing layers for the seed layer 112, the antiferromagnetic layer 114, the pinned layer 120/120', the barrier layer 130/130', the free layer 140/140' and the capping layer 116. The magnetic tunneling junction is defined by patterning the magnetic tunneling layers, via step 206. Processing of the magnetic tunneling junctions and/or magnetic memory array may then be continued.

A method and system has been disclosed for providing an improved magnetic s tunneling junction. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetic tunneling junction comprising:

a free layer;

a pinned layer; and a barrier layer between the free layer and the pinned layer, the free layer and the pinned layer being ferromagnetic, the barrier layer being an insulator; and the magnetic tunneling junction being coupled to an α-Ta lead;

wherein the α-Ta lead includes a seed layer and a Ta layer on the seed layer, the seed layer being configured to ensure that the Ta layer is α-Ta, the seed layer including Cr.

2. The magnetic tunneling junction of claim 1 wherein the pinned layer is a synthetic ferromagnetic layer.

3. The magnetic tunneling junction of claim 1 wherein the α-Ta lead is a bottom lead.

4. A magnetic memory comprising:

a plurality of magnetic tunneling junctions, each of the plurality of magnetic tunneling junctions including a free layer, a pinned layer and a barrier layer between the free layer and the pinned layer, the free layer and the pinned layer being ferromagnetic, the barrier layer being an insulator; and a plurality of α-Ta leads coupled to the plurality of magnetic tunneling junctions;

wherein each of the plurality of α-Ta leads includes a seed layer and a Ta layer on the seed layer, the seed layer being configured to ensure that the Ta layer is α-Ta the seed layer including Cr.

5. The magnetic memory of claim 4 wherein the pinned layer is a synthetic ferromagnetic layer.

6. The magnetic memory of claim 4 wherein the plurality of α-Ta leads is a plurality of bottom leads.

7. A method for providing a magnetic memory comprising the steps of:

(a) providing a plurality of α-Ta leads, wherein the α-Ta providing lead step (a) further includes the steps of:

(a1) providing a seed layer for each of the plurality of α-Ta leads, the seed layer being a Cr layer; and (a2) providing a Ta layer on the seed layer for each of the plurality of α-Ta leads the seed layer being configured to ensure that the layer of Ta is α-Ta;

(b) providing a plurality of magnetic tunneling junctions coupled to the plurality of α-Ta leads, each of the plurality of magnetic tunneling junctions including a free layer, a pinned layer and a barrier layer between the free layer and the pinned layer, the free layer and the pinned layer being ferromagnetic, the barrier layer being an insulator.

8. The method of claim 7 wherein the magnetic tunneling junction providing step (b) further includes the step of;

(b1) providing a synthetic ferromagnetic layer as a pinned layer.

9. The method of claim 7 wherein the α-Ta lead is a bottom lead.

10. A method for providing a magnetic tunneling junction comprising the steps of:

(a) providing a free layer;

(b) providing a pinned layer; and (c) providing a barrier layer between the free layer and the pinned layer, the free layer and the pinned layer being ferromagnetic, the barrier layer being an insulator, wherein the magnetic tunneling junction being coupled to an α-Ta lead, the α-Ta lead seed layer and a Ta layer, the seed layer being a Cr layer configured to ensure that the layer of Ta is α-Ta.

11. The method of claim 10 wherein the pinned layer providing step (b) further includes the step of:

(b1) providing a synthetic ferromagnetic pinned layer.

12. The method of claim 10 wherein the α-Ta lead is a bottom lead.

* * * * *